(12) United States Patent
Lin

(10) Patent No.: US 7,425,767 B2
(45) Date of Patent: Sep. 16, 2008

(54) CHIP STRUCTURE WITH REDISTRIBUTION TRACES

(75) Inventor: Mou-Shiung Lin, Hsin-Chu (TW)

(73) Assignee: Megica Corporation, Hsin-Chu (TW)

( * ) Notice: Subject to any disclaimer, the term of this patent is extended or adjusted under 35 U.S.C. 154(b) by 0 days.

(21) Appl. No.: 11/861,290

(22) Filed: Sep. 26, 2007

(65) Prior Publication Data

US 2008/0012132 A1 Jan. 17, 2008

Related U.S. Application Data

(63) Continuation of application No. 11/181,244, filed on Jul. 14, 2005, now Pat. No. 7,319,277.

(30) Foreign Application Priority Data

Jul. 14, 2004 (TW) .............................. 93120946 A

(51) Int. Cl.
*H01L 23/485* (2006.01)
(52) U.S. Cl. ...................... 257/781; 257/786; 257/784; 257/E23.02

(58) Field of Classification Search ................. 257/784, 257/781, 786, E23.02
See application file for complete search history.

(56) References Cited

U.S. PATENT DOCUMENTS

| | | | |
|---|---|---|---|
| 4,463,059 A * | 7/1984 | Bhattacharya et al. ....... 428/620 |
| 5,646,439 A * | 7/1997 | Kitayama et al. ............ 257/632 |
| 6,229,221 B1 * | 5/2001 | Kloen et al. ................. 257/784 |
| 6,780,748 B2 * | 8/2004 | Yamaguchi et al. ......... 438/612 |
| 2003/0109079 A1 * | 6/2003 | Yamaguchi et al. ......... 438/107 |
| 2003/0230803 A1 * | 12/2003 | Matsuo ........................ 257/734 |
| 2005/0121804 A1 * | 6/2005 | Kuo et al. .................... 257/781 |
| 2007/0085938 A1 * | 4/2007 | Yamazaki et al. ............. 349/43 |
| 2007/0170551 A1 * | 7/2007 | Lindgren ..................... 257/626 |

* cited by examiner

*Primary Examiner*—Evan Pert
*Assistant Examiner*—Victor A. Mandala, Jr.

(57) ABSTRACT

A semiconductor chip or wafer comprises a passivation layer and a circuit line. The passivation layer comprises an inorganic layer. The circuit line is over and in touch with the inorganic layer of the passivation layer, wherein the circuit line comprises a first contact point connected to only one second contact point exposed by an opening in the passivation layer, and the positions of the first contact point and the only one second contact point from a top view are different, and the first contact point is used to be wirebonded thereto.

20 Claims, 10 Drawing Sheets

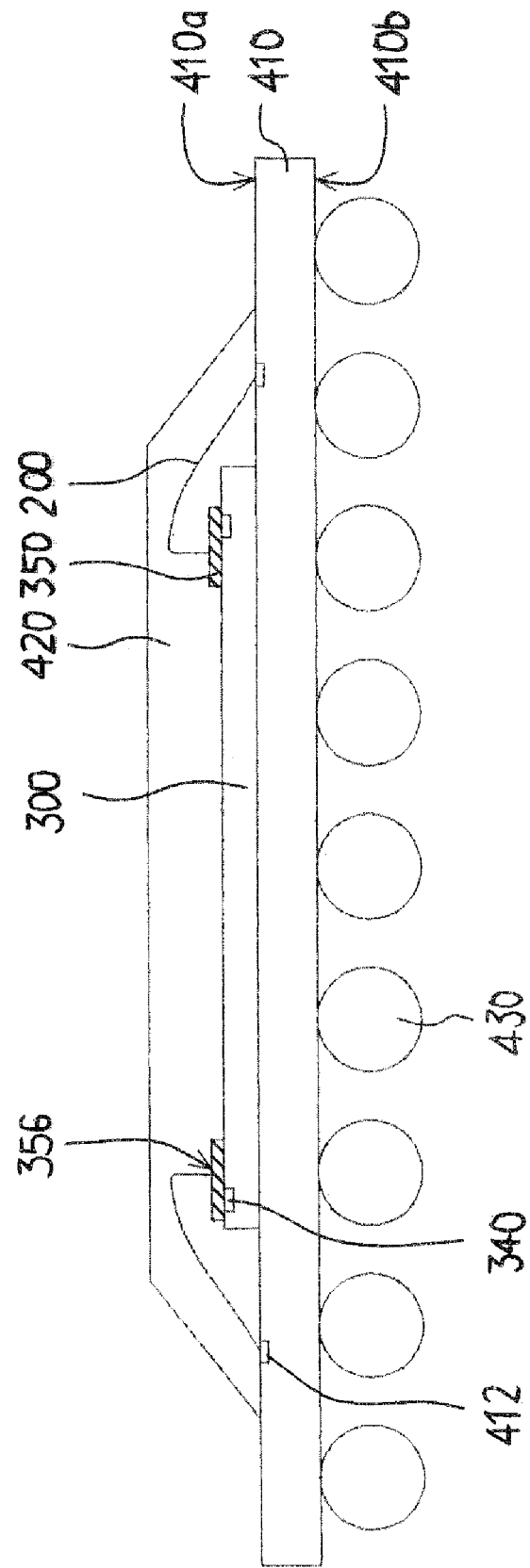

CHIP STRUCTURE WITH REDISTRIBUTION TRACES

This application is a continuation of application Ser. No. 11/181,244, filed on Jul. 14, 2005, now pending.

RELATED PATENT APPLICATION

This application is related to U.S. Pat. No. 5,384,488, U.S. Pat. No. 5,969,424, U.S. Pat. No. 6,187,680, U.S. Pat. No. 6,229,221, U.S. Pat. No. 6,593,649 and R.O.C. Patent No. 594,953, which are herein incorporated by reference in its entirety. This application is related to Ser. No. 10/434,524, filed on May 8, 2003, now pending, and to Ser. No. 10/434,142, filed on May 8, 2003, now pending.

BACKGROUND OF THE INVENTION

1. Field of the Invention

The invention relates to a semiconductor chip, chip package and process for forming the same. More particularly, this invention relates to a semiconductor chip, chip package and process for forming the same, wherein wirebonds are suited for being wirebonded to redistribution circuit lines on the semiconductor chip.

2. Description of the Related Art

In recent years, the application of semiconductor in our life has increased with the exuberant electronics industry. As a result, a number of semiconductor manufacturing techniques are also developing rapidly. A typical semiconductor IC manufacturing process can be largely divided into two stages; the first stage is associated with the manufacturing of semiconductor IC chip, which generally comprises the steps of growing singe-crystal silicon, depositing epitaxial layer of Si, manufacturing electronic devices, such as transistors, metal oxide semiconductors (MOS) or passive devices, and manufacturing metal interconnections, . . . etc. The second stage is the packaging process. The purpose of the packaging process is to prevent the IC chips from reaching the outside atmosphere and moisture. What is more, a finished chip package must also be electrically connected to an external circuitry.

In general, a typical electrical connection for a chip package can be processed by a wire-bonding process, a tape automatic bonding (TAB) process, or a flip chip (FC) process. Of these three kinds, the industrial infrastructure for wirebonding is the most mature one, and it has been widely used by various kinds of electronic packages today. In the wire-bonding process, the connection points of a carrier, which can be either a holding substrate or a lead frame, and a chip are joined with a wire electrically connecting the carrier and the chip such that electrical signals can be transmitted/received to/from an external circuitry. Typically, the connection points of the carrier and the corresponding ones on the chip are not placed far apart to make the wire-bonding process simple and to prevent the bonded wires from winding. However, in cases that the layout of the connection points on the carrier is changed or that the chips and carriers are produced by different companies, the wire-bonding process can become less straightforward. Moreover, the electrical properties reduce in that elongated wirebonding wires are used to connect the chip and carrier. As a result, signals transmitted from the chip may be attenuated because of the longer conduction path used to connect the chip and the carrier. Moreover, the strength of the bonding wire becomes a serious issue. For solving the above problem, a redistribution routing can be made to alter the layout of the chip, which leads the chip suitable for being wirebonded thereto. It is worthy of note that the wire-bonding process requires a sufficient loading force to assure the connectivity between the wire and the pad is reliable. Attributed to this process, the elements under the bonding pad will be subjected to an undesired shock during the wire bonding process. Thus, the delicate electronic devices, such as transistors, MOS or passive devices, are typically not to be placed under the wirebond pad to avoid any potential damage caused by such an effect.

R.O.C. patent application Serial No. 90100339, now Patent No. 594,953, teaches the methods and structures of a chip structure with redistribution lines and a process for the same.

FIG. 1 is a cross-sectional view showing a semiconductor chip suited for being wirebonded thereto according to R.O.C. patent application Serial No. 90100339. Referring to FIG. 1, a chip structure 100 is shown with a semiconductor substrate 110, insulation layers 125*a*, 125*b* and 125*c*, metal layers 135*a* and 135*b*, a redistribution metal layer 160, a pad 140, a passivation layer 145, an elastomer layer 150, a top polymer layer 190, and a wirebonded wire 200. Multiple IC devices 115 are formed in or on the semiconductor substrate 110, with a trench 120 incorporated in the semiconductor substrate 110 and between the IC devices 115. Furthermore, the insulation layers 125*a*, 125*b*, and 125*c* are formed over the semiconductor substrate 110. The metal layers 135*a* and 135*b* and pad 140 are respectively formed on the insulation layers 125*a*, 125*b* and 125*c*. The metal layers 135*a* and 135*b* and pad 140 are electrically connected to the IC devices 115 through metal vias 130*a* 130*b*, and 130*c*.

Referring to FIG. 1, the passivation layer 145 and elastomer layer 150 are formed over the insulation layer 125*c*. An opening 155 in the passivation layer 145 and elastomer layer 150 exposes the pad 140. The redistribution metal layer 160 extends into the opening 155 and on the elastomer layer 150. The top polymide (PI) layer 190 covers the elastomer layer 150 and the redistribution metal layer 160. An opening 195 is in the top polymer layer 190 and exposes the redistribution metal layer 160. The wirebonded wire 200 is bonded on the redistribution metal layer 160 exposed by the opening 195 in the top polymer layer 190.

The elastomer layer 150 may be polyimide or elastic rubber, which can be prevented from being damaged due to the wirebonding process. However, the above process is costly because the elastomer layer 150 between the redistribution metal layer 160 and the passivation layer 140 should be made.

SUMMARY OF THE INVENTION

The objective of the invention is to provide a semiconductor chip with a redistribution trace, which can be formed over and in touch with a passivation layer and the circuits under the wirebond pad of the redistribution trace can be prevented from being damaged due to the wirebonding process.

In order to reach the above objectives, the present invention provides a semiconductor chip or wafer comprises a passivation layer and a circuit line. The passivation layer comprises an inorganic layer. The circuit line is over and in touch with the inorganic layer of the passivation layer, wherein the circuit line comprises a first contact point connected to only one second contact point exposed by an opening in the passivation layer, the positions of the first contact point and the only one second contact point from a top view are different, and the first contact point is used to be wirebonded thereto.

In a case, the circuit line may comprise a metal layer having a thickness greater than 1 µm and comprising gold with greater than 90.

In another case, the circuit line may comprise a metal layer having a thickness greater than 1 μm and comprising silver with greater than 90.

In another case, the circuit line may comprise a metal layer having a thickness greater than 1 μm and comprising copper with greater than 90.

In another case, the circuit line may comprise a metal layer having a thickness greater than 1 μm and comprising platinum with greater than 90.

In another case, the circuit line may comprise a metal layer having a thickness greater than 1 μm and comprising palladium with greater than 90.

In another case, the circuit line may comprise a metal layer having a thickness greater than 1 μm and comprising rhodium with greater than 90.

The accompanying drawings are included to provide a further understanding of the invention, and are incorporated as a part of this specification. The drawings illustrate embodiments of the invention and, together with the description, serve to explain the principles of the invention.

BRIEF DESCRIPTION OF THE DRAWINGS

FIG. 3A is a cross-sectional view showing the invented semiconductor chip applied to a BGA package according to an embodiment of the present invention.

DESCRIPTION OF THE PREFERRED EMBODIMENTS

Figure 1:
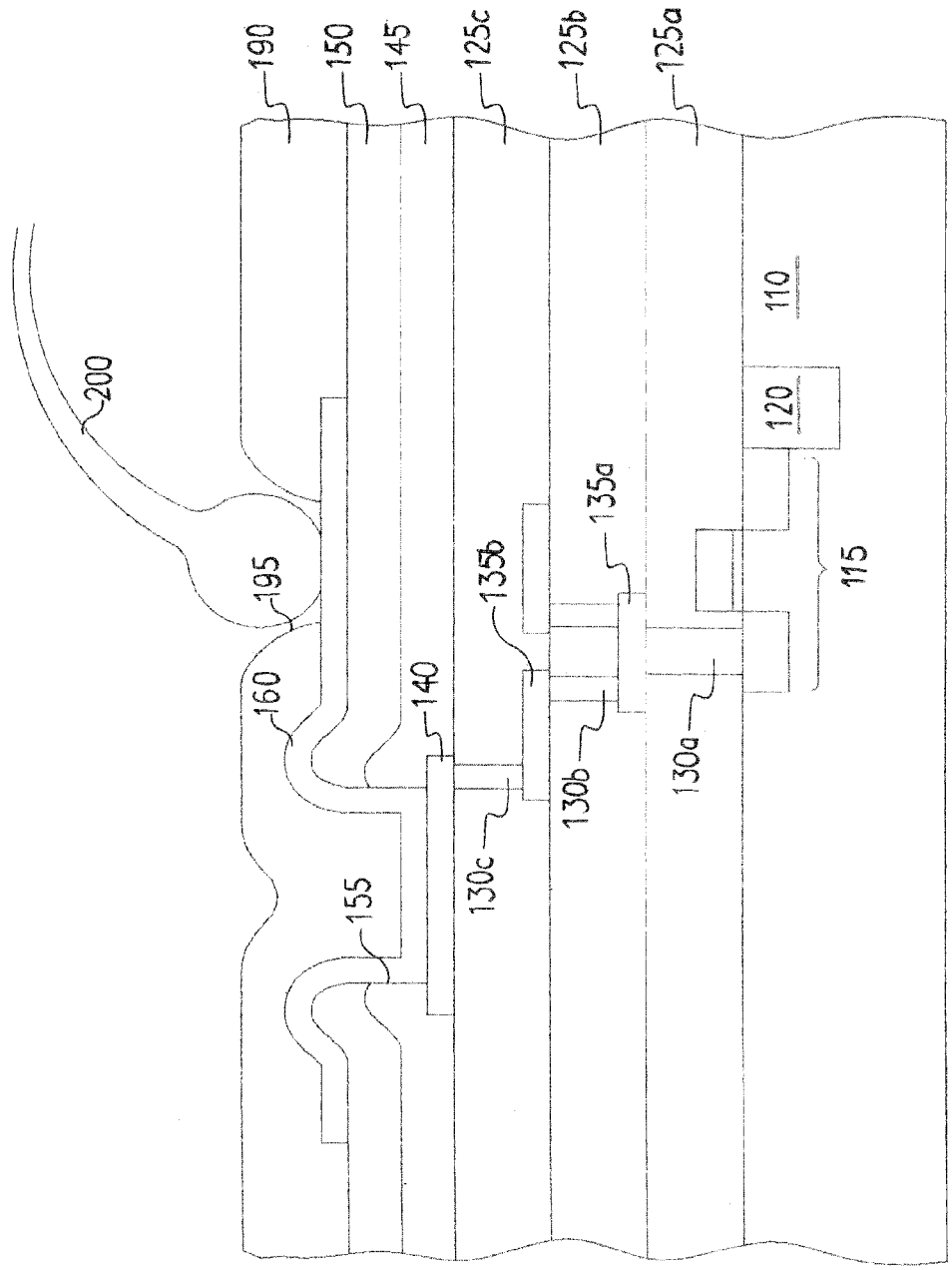
FIG. 1 is a cross-sectional view showing a semiconductor chip suited for being wirebonded thereto according to R.O.C. patent application Serial No. 90100339.
Figure 2A:
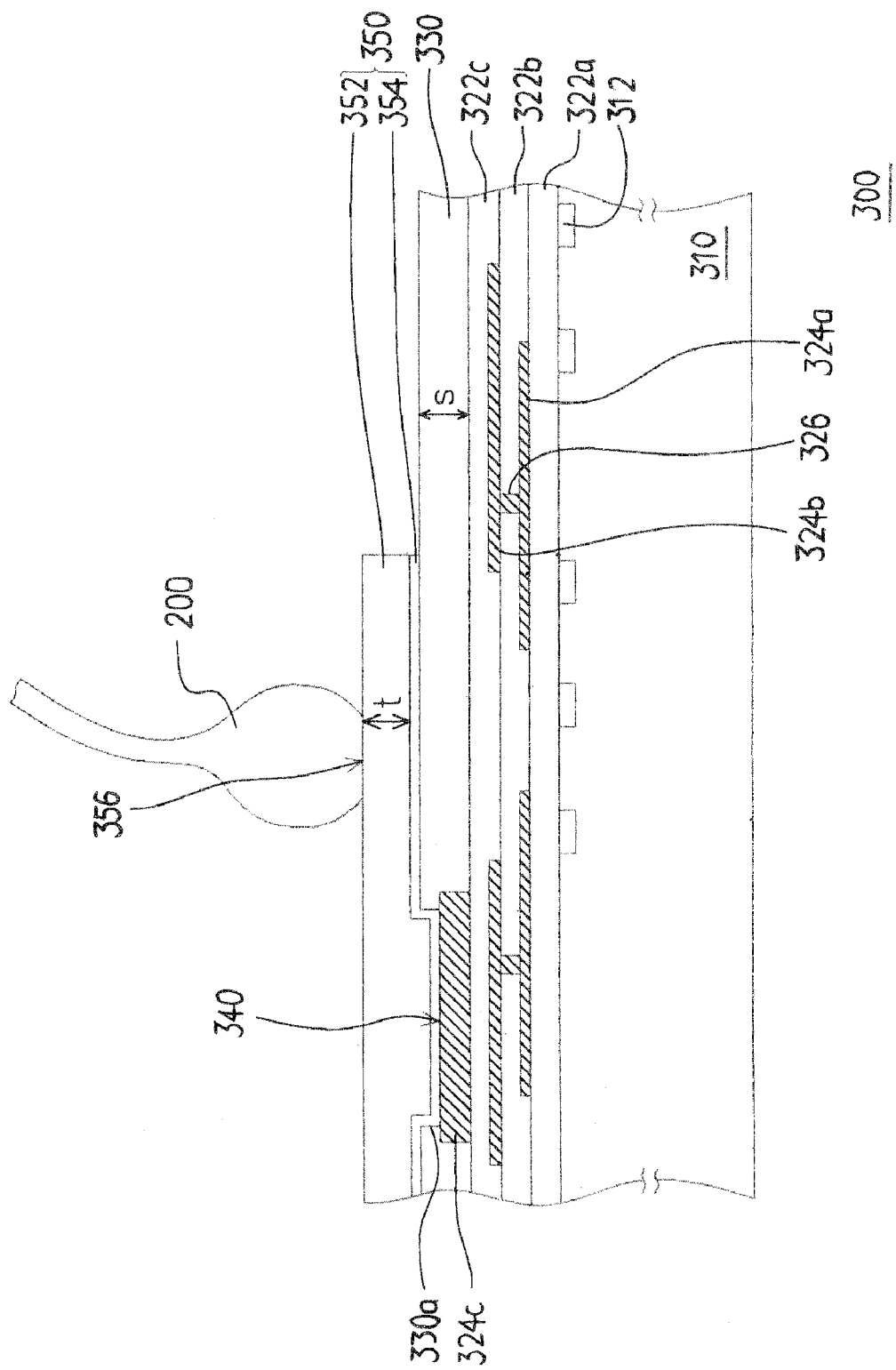
FIG. 2A is a cross-sectional view showing a semiconductor chip according to an embodiment of the invention.

Referring now to FIG. 2A, which is a cross-sectional view showing a semiconductor chip according to an embodiment of the invention. In FIG. 2A, electronic devices 312, such as MOS devices, transistors, or passive devices, are formed in and on the semiconductor substrate 310. Multiple dielectric layers 322a, 322b and 322c are formed over the semiconductor substrate 310. Multiple circuit layers 324a, 324b and 324c are formed on the dielectric layers 322a, 322b and 322c, respectively. The circuit layers 324a, 324b and 324c can be connected to each other and connected to the electrical devices 312 through multiple metal vias 326. The circuit layers 324a, 324b and 324c may include aluminum, an aluminum-copper alloy or an aluminum-silicon alloy formed by a sputter process. Alternatively, the circuit layers 324a, 324b and 324c may include copper formed by a damascene process.

Referring to FIG. 2A, a passivation layer 330 is formed over the dielectric layers 322a, 322b and 322c. The topmost circuit layer 324c includes a first contact point 340 exposed through an opening 330a in the passivation layer 330. The thickness s of the insulation layer 330 may be greater than 0.35 μm, and may be composed of a silicon-oxide layer, a silicon-nitride layer, a phosphosilicate glass (PSG) layer, or a composite structure comprising the above-mentioned layers. The passivation layer 330 comprises one or more insulating layers, such as silicon-nitride layer or silicon-oxide layer, formed by CVD processes. In a case, a silicon-nitride layer with a thickness of between 0.2 and 1.2 μm is formed over a silicon-oxide layer with a thickness of between 0.1 and 0.8 μm. Generally, the passivation layer 330 comprises a topmost silicon-nitride layer in the finished chip structure. The passivation layer 330 comprises a topmost CVD insulating layer in the finished chip structure. The passivation layer 330 prevents the penetration of mobile ions, such as sodium ions, moisture, transition metals, such as gold, silver, copper, and so on, and other contaminations. The passivation layer 330 is used to protect the underlying devices, such as transistors, MOS devices, polysilicon resistors, poly-to-poly capacitors, and fine-line metal interconnections.

Referring to FIG. 2A, a redistribution layer 350 is formed over and in touch with the passivation layer 330 and connected to the connection point 340. For example, the redistribution layer 350 is formed over and in touch with the above-mentioned nitride layer of the passivation layer 330. From a top view, the redistribution layer 350 includes a second contact point 356 having a different position from that of the first contact point 340 of the circuit layer 324c. A wirebonded wire 360 can be bonded on the second contact point 356. The redistribution layer 350 may be composed of an adhesion/barrier layer 354 and a bulk metal layer 352, the bulk metal layer 352 being electroplated on the adhesion/barrier layer 354. The adhesion/barrier layer 354 may comprise chromium, a chromium-copper alloy, titanium, a titanium-tungsten alloy, titanium nitride, tantalum or tantalum nitride, for example. The bulk metal layer 352 may be a single metal layer and may have a thickness a1 thicker than 1 μm, and preferably between 2 μm and 30 μm, wherein the bulk metal layer 312 may comprise gold with greater than 90 weight percent, and, preferably, greater than 97 weight percent. Alternatively, a seed layer (unshown), such as gold, can be sputtered on the adhesion/barrier layer 354, preferably comprising a titanium-tungsten alloy, and then the bulk metal layer 312 is electroplated on the seed layer.

In another case, the bulk metal layer 352 may be a single metal layer and may have a thickness a1 thicker than 1 μm, and preferably between 2 μm and 30 μm, wherein the bulk metal layer 352 may comprise silver with greater than 90 weight percent, and, preferably, greater than 97 weight percent. Alternatively, a seed layer (unshown), such as silver, can be sputtered on the adhesion/barrier layer 354 and then the bulk metal layer 352 is electroplated on the seed layer, wherein the adhesion/barrier layer 354 may comprise chromium, a chromium-copper alloy, titanium, a titanium-tungsten alloy, titanium nitride, tantalum or tantalum nitride, for example.

In another case, the bulk metal layer 352 may be a single metal layer and may have a thickness a1 thicker than 1 μm, and preferably between 2 μm and 30 μm, wherein the bulk metal layer 352 may comprise copper with greater than 90 weight percent, and, preferably, greater than 97 weight percent. Alternatively, a seed layer (unshown), such as copper, can be sputtered on the adhesion/barrier layer 354, preferably comprising titanium, chromium or a chromium-copper alloy, and then the bulk metal layer 352 is electroplated on the seed layer, wherein the adhesion/barrier layer 354 may comprise other materials, such as a titanium-tungsten alloy, titanium nitride, tantalum or tantalum nitride, for example. Alternatively, the adhesion/barrier layer 354 may be formed by sputtering a chromium layer and then sputtering a chromium-copper layer on the chromium layer.

In another case, the bulk metal layer 352 may be a single metal layer and may have a thickness a1 thicker than 1 µm, and preferably between 2 µm and 30 µm, wherein the bulk metal layer 352 may comprise platinum with greater than 90 weight percent, and, preferably, greater than 97 weight percent. Alternatively, a seed layer (unshown), such as platinum, can be sputtered on the adhesion/barrier layer 354 and then the bulk metal layer 352 is electroplated on the seed layer, wherein the adhesion/barrier layer 354 may comprise chromium, a chromium-copper alloy, titanium, a titanium-tungsten alloy, titanium nitride, tantalum or tantalum nitride, for example.

In another case, the bulk metal layer 352 may be a single metal layer and may have a thickness a1 thicker than 1 µm, and preferably between 2 µm and 30 µm, wherein the bulk metal layer 352 may comprise palladium with greater than 90 weight percent, and, preferably, greater than 97 weight percent. Alternatively, a seed layer (unshown), such as palladium, can be sputtered on the adhesion/barrier layer 354 and then the bulk metal layer 352 is electroplated on the seed layer, wherein the adhesion/barrier layer 354 may comprise chromium, a chromium-copper alloy, titanium, a titanium-tungsten alloy, titanium nitride, tantalum or tantalum nitride, for example.

In another case, the bulk metal layer 352 may be a single metal layer and may have a thickness a1 thicker than 1 µm, and preferably between 2 µm and 30 µm, wherein the bulk metal layer 352 may comprise rhodium with greater than 90 weight percent, and, preferably, greater than 97 weight percent. Alternatively, a seed layer (unshown), such as rhodium, can be sputtered on the adhesion/barrier layer 354 and then the bulk metal layer 352 is electroplated on the seed layer, wherein the adhesion/barrier layer 354 may comprise chromium, a chromium-copper alloy, titanium, a titanium-tungsten alloy, titanium nitride, tantalum or tantalum nitride, for example.

In another case, the adhesion/barrier layer 354 may comprise titanium, a titanium-tungsten alloy, titanium nitride, tantalum or tantalum nitride, for example. Alternatively, the adhesion/barrier layer 354 may be formed by sputtering a chromium layer and then sputtering a chromium-copper layer on the chromium layer. The bulk metal layer 352 may be multiple metal layers, such as first and second metal layers, the second metal layer being on the first metal layer. The first metal layer may have a thickness a2 thicker than 1 µm, and preferably between 2 µm and 30 µm, wherein the first metal layer 352 may comprise copper with greater than 90 weight percent, and, preferably, greater than 97 weight percent. The second metal layer may comprise nickel, for example, and may have a thickness thicker than 1 µm, and preferably between 2 µm and 5 µm. Alternatively, a seed layer (unshown), such as copper, can be sputtered on the adhesion/barrier layer 331, then the first metal layer is electroplated on the seed layer, and then the second metal layer is electroplated on the first metal layer.

In another case, the adhesion/barrier layer 354 may comprise titanium, a titanium-tungsten alloy, titanium nitride, tantalum or tantalum nitride, for example. Alternatively, the adhesion/barrier layer 354 may be formed by sputtering a chromium layer and then sputtering a chromium-copper layer on the chromium layer. The bulk metal layer 352 may be multiple metal layers, such as first, second and third metal layers, the second metal layer being on the first metal layer, and the third metal layer being on the second metal layer. The first metal layer may have a thickness a2 thicker than 1 µm, and preferably between 2 µm and 30 µm, wherein the first metal layer 352 may comprise copper with greater than 90 weight percent, and, preferably, greater than 97 weight percent. The second metal layer may comprise nickel, for example, and may have a thickness thicker than 1 µm, and preferably between 2 µm and 5 µm. The third metal layer may be made of gold, for example, and may have a thickness thicker than 100 angstroms, and preferably between 1 µm and 1000 angstroms. Alternatively, a seed layer (unshown), such as copper, can be sputtered on the adhesion/barrier layer 331, then the first metal layer is electroplated on the seed layer, and then the second metal layer is electroplated on the first metal layer.

The above-mentioned adhesion/barrier layer 354 and bulk metal layer 352 is formed on a semiconductor wafer before the semiconductor wafer is divided into multiple semiconductor chips 300 shown in FIG. 2A. After the semiconductor wafer is divided into multiple semiconductor chips 300, the wirebond wire 200 can be bonded on the bulk metal layer 352 for connecting the semiconductor chip 300 to another chip or a substrate, such as a printed circuit board.

Figure 2B:
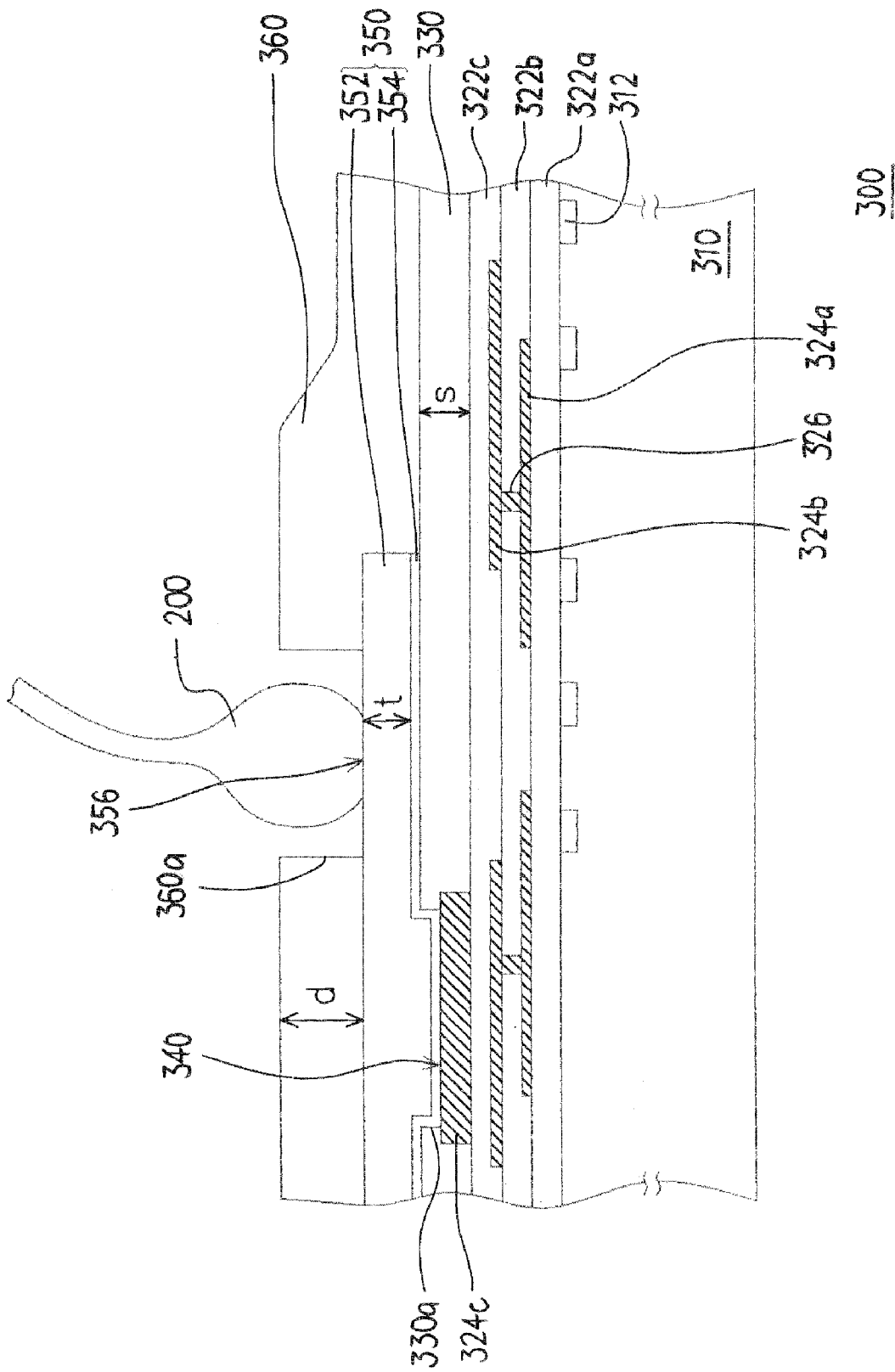
FIG. 2B is a cross-sectional view showing a semiconductor chip suited for being wirebonded thereto according to another embodiment of the invention.

FIG. 2B is a cross-sectional view showing a semiconductor chip suited for being wirebonded thereto according to another embodiment of the invention. Optionally, as shown in FIG. 2B, an encapsulating layer 360 can be deposited on the redistribution circuit layer 350 and the passivation layer 330 using a spin-coating process. An opening 360a in the encapsulating layer 360 exposes the second connection point 356. The wirebond wire 200 can be bonded on the redistribution circuit layer 350 through the opening 360a in the encapsulating layer 360. The thickness d of the encapsulating layer 360 may be thicker than 1 µm, and, preferably, between 2 µm and 15 µm. The encapsulating layer 360 may be made of polymer, such as polyimide (PI), benzocyclobutene (BCB), porous dielectric material, paralene, epoxy, or elastomer.

Referring to FIGS. 2A and 2B, the second contact point 356 formed over the electronic devices 312, such as MOS devices, transistors, or passive devices, can be used to be wirebonded thereto. There is relatively much space over the passivation layer 330 that can be employed to be wirebonded thereto. As compared to the conventional art that does not allow IC I/O pads to be placed over the active devices, this invention allows a greater flexibility for the locating of the redistributed wirebond point 356.

Moreover, the redistribution layer 350 allows the semiconductor chip 300 applied to various kinds of packaging structures. For example, the redistribution layer 350 may allow the semiconductor chip 300 to be electrically connected to a leadframe, a flexible substrate or a printed circuit board. Besides, even without the use of an elastomer layer used in the admitted prior art, the wirebond wire 200 can still be bonded on the redistribution metal layer 350 over the electronic devices 312, and the negative impact on the electronic devices 312 during a wirebonding process can be avoided. The invented chip structure 300 removes the need for the elastomor layer, so the fabrication of the semiconductor chip 300 is economic and time-saving.

The above-mentioned semiconductor chip 300 may be applied for various chip packages employing a wirebonding process, such as BGA package, TSOP package or SOJ package, affiliated with the redistribution metal layer 350.

Figure 3B:
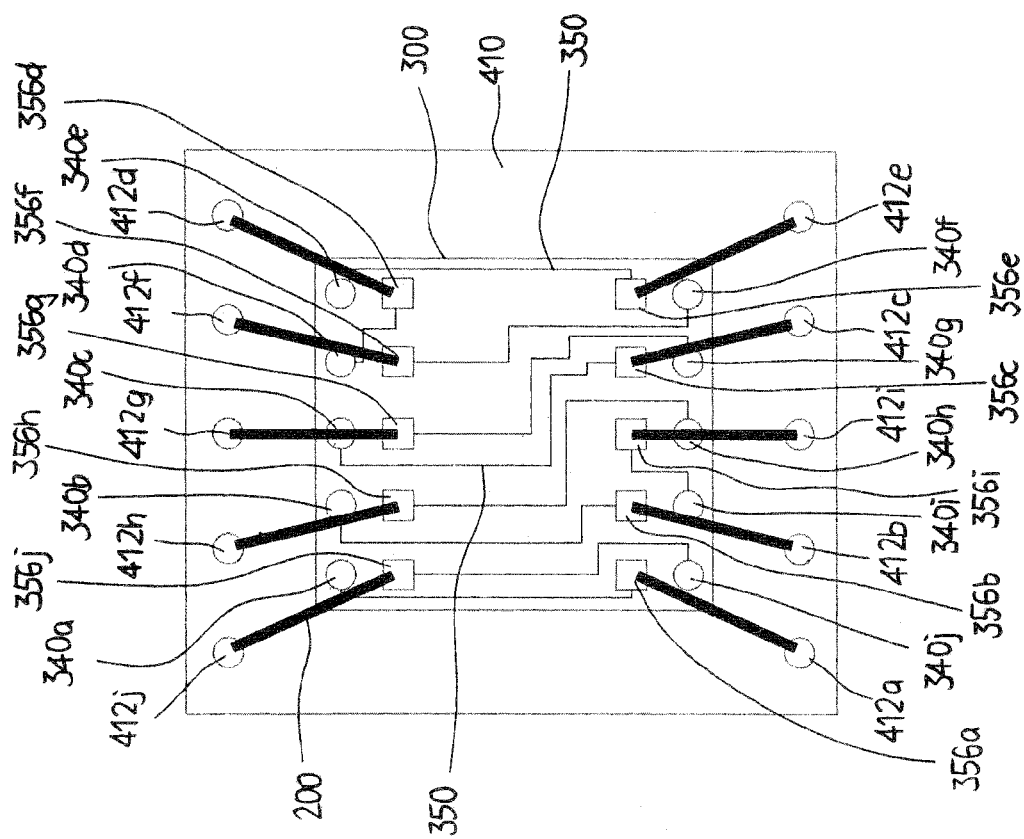
FIG. 3B is a top view showing the same.

FIG. 3A is a cross-sectional view showing the invented semiconductor chip applied to a BGA package according to an embodiment of the present invention. FIG. 3B is a top view showing the same. In reference to FIG. 3A, the semiconductor chip 300 is mounted on a top surface of a printed circuit board or substrate 410. The wirebond wires 200 connect wirebond pads 356 of the redistribution metal layer 350 on the semiconductor chip 300 to the other wierbond pads 412 on the printed circuit board 410. A packaging polymer structure 420 covers the semiconductor chip 300 and the wirebond wires 200. Multiple solder balls 430 are formed on a bottom surface of the printed circuit board 410 to connect the printed circuit board 410 to an external circuitry component (unshown).

In reference to FIG. 3A and FIG. 3B, the substrate 410 has multiple third connection points 412a, 412b, 412c, 412d, 412e, 412f, 412g, 412h, 412i and 412j exposed by openings in the passivation layer; the semiconductor chip 300 has multiple first connection points 340a, 340b, 340c, 340d, 340e, 340f, 340g, 340h, 340i and 340j; the redistribution metal layer 350 have multiple second connection points 356a, 356b, 356c, 356d, 356e, 356f, 356g, 356h, 356i and 356j. Multiple rerouting lines of the redistribution layer 350 connect the first connection points 340a, 340b, 340c, 340d, 340e, 340f, 340g, 340h, 340i and 340j to the second connection points 356a, 356b, 356c, 356d, 356e, 356f, 356g, 356h, 356i and 356j respectively, with the positions, sequence or pin assignment of the first connection point, such as 340a, and the second connection point, such as 356a, from a top view being different. The wirebonded wires 200 connect the second connection points 356a, 356b, 356c, 356d, 356e, 356f, 356g, 356h, 356i and 356j to the third connection points 412a, 412b, 412c, 412d, 412e, 412f, 412g, 412h, 412i and 412j.

In another situation where the redistribution metal layer 350 is unformed, Multiple wirebonded wires also can connect the first connection points 340a, 340b, 340c, 340d, 340e, 340f, 340g, 340i and 340j to the third connection points 412j, 412h, 412g, 412f, 412d, 412e, 412c, 4121, 412b and 412a, respectively.

As described above, the pin assignment or sequence of the first connection points 340a-340f differs from that of the second connection point 356a-356f. As described above, the pin assignment of the third connection points connected to the first connection points, original IC pads, may be different from that of the third connection points connected to the second connection points, redistributed pads.

Figure 3C:
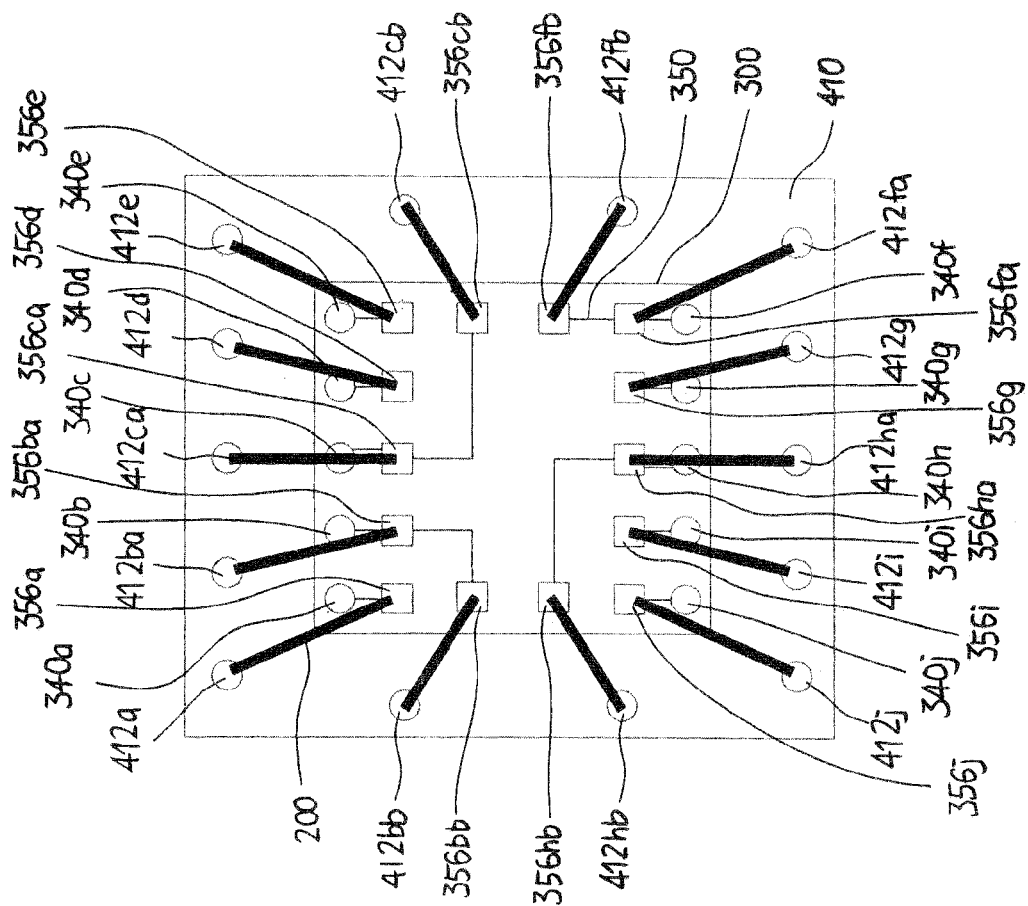
FIGS. 3C and 3D are top views showing semiconductor chips applied to a BGA package according to other embodiments of the invention.

It is worth mentioning that the first and second connection points are not limited to one-to-one manner. FIG. 3C is a top view showing a semiconductor chip applied to a BGA package according to another embodiment of the invention. The first connection point alone can be connected to more than one second connection points through the redistribution metal layers. For example, in reference to FIG. 3C, the first connection point 340b can be connected to two second connection points 356ba and 356bb. The wirebond wires 200 can connect the two second connection points 356ba and 356bb to the third connection points 412ba and 412bb.

Figure 3D:
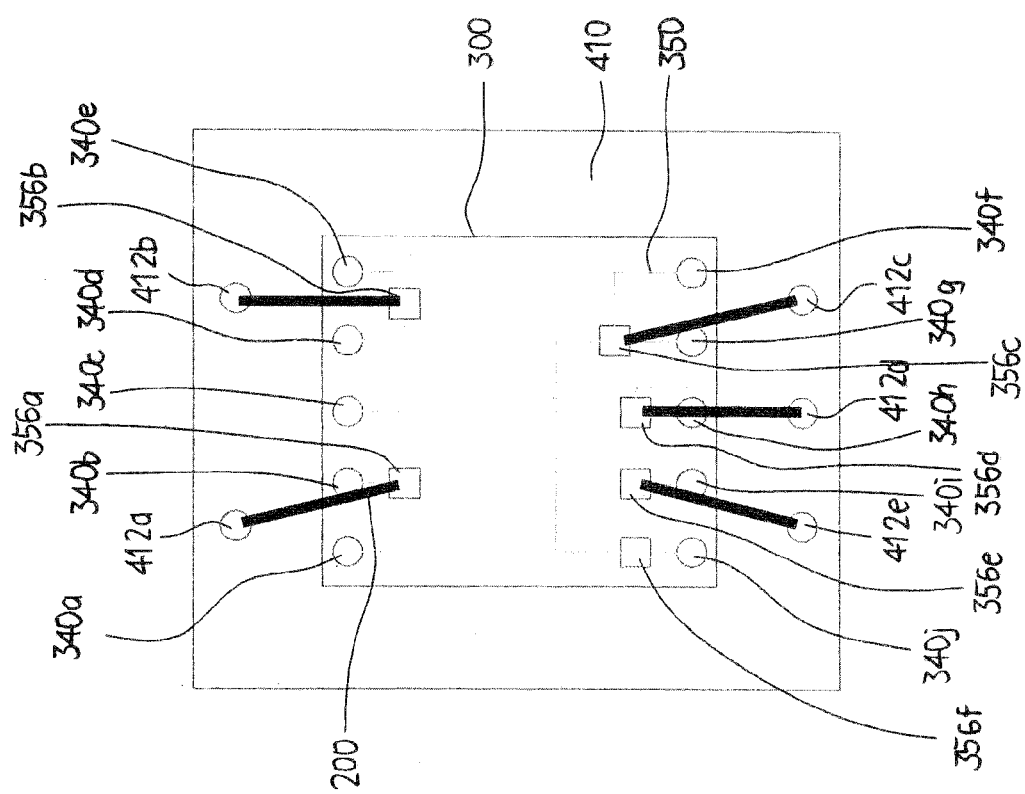

However, the invention is not just limited to such applications. FIG. 3D is a schematic top view showing a semiconductor chip applied to a BGA package according to another embodiment of the invention. A rerouting line can connect multiple first connection points to a single second connection point. For example, in reference to FIG. 3D, the multiple first connection points 340a, 340b and 340c are connected to the single second connection point 356a via the rerouting line of the redistribution metal layer. The wirebonded wire 200 connects the second connection point 356a to the third connection point 412a.

Figure 4A:
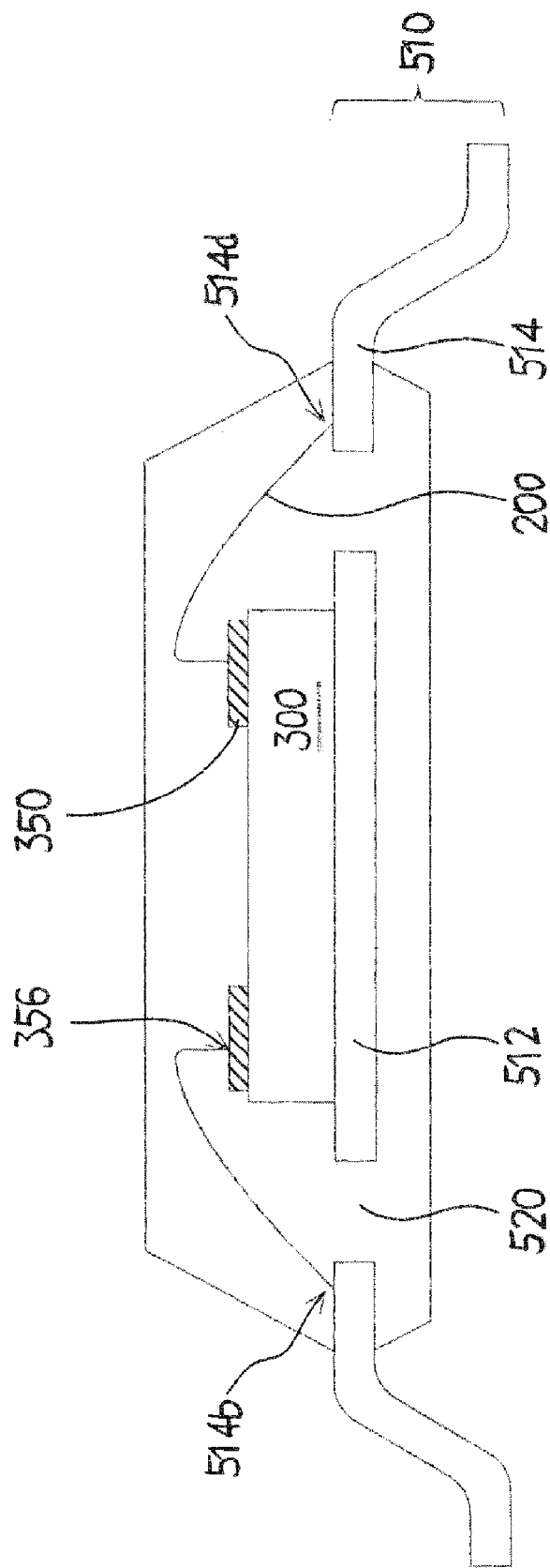
FIG. 4A is a cross-sectional view showing the invented semiconductor chip applied to a TSOP package according to an embodiment of the present invention.
Figure 4B:
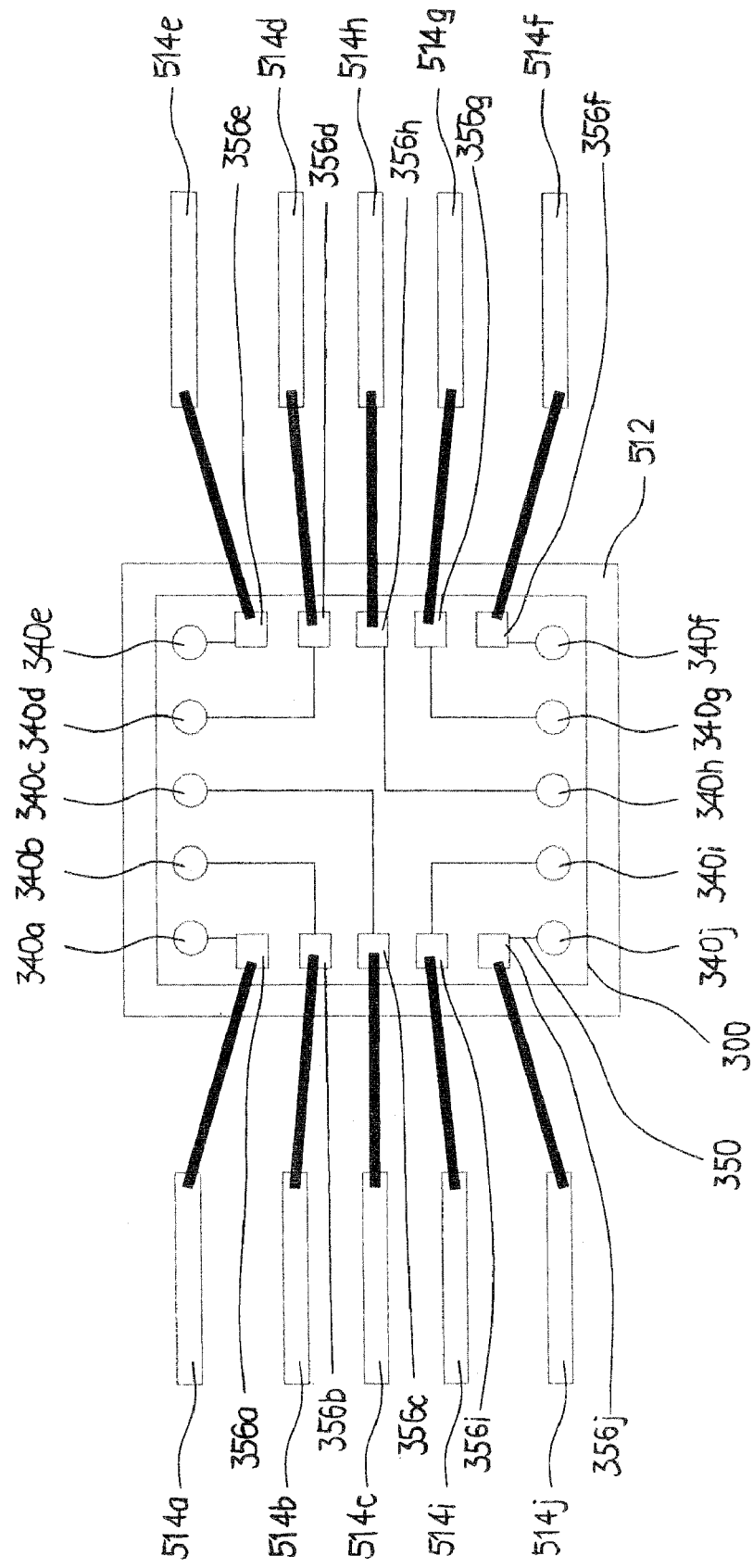
FIG. 4B is a top view showing the same.

FIG. 4A is a cross-sectional view showing the invented semiconductor chip applied to a TSOP package according to an embodiment of the present invention. FIG. 4B is a top view showing the same. Referring to FIG. 4A, the semiconductor chip 300 with a redistribution metal layer 350 is mounted on a die pad 512 of a lead frame 510. Multiple wirebond wires 200 connect the redistribution metal layer 350 of the semiconductor chip 300 to multiple leads 514 of the lead frame 510. A packaging polymer structure 520 encapsulates the semiconductor chip 300, the wirebond wires 200 and the die pad 512. The leads 514 of the TSOP chip package's lead frame 510 are bent in a Gull Wing fashion.

Referring to FIG. 4A and FIG. 4B, multiple rerouting lines of the redistribution metal layer 350 connect the first connection points 340a, 340b, 340c, 340d, 340e, 340f, 340g, 340h, 340i and 340j to the second connection points 356a, 356b, 356c, 356d, 356e, 356f, 356g, 356h, 356i and 356j respectively, with the positions, sequence or pin assignment of the first connection point, such as 340a, and the second connection point, such as 356a, from a top view being different. Multiple wirebond wires connect the second connection points 356a, 356b, 356c, 356d, 356e, 356f, 356g, 356h, 356i and 356j to the third connection points of the leads 514a, 514b, 514c, 514d, 514e, 514f, 514g, 514h, 514i and 514j respectively.

In another situation where the redistribution metal layer 350 is unformed, Multiple wirebonded wires also can connect the first connection points 340a, 340b, 340c, 340d, 340e, 340f, 340g, 340i and 340j to the above-mentioned printed circuit board 410 for fabricating a BGA package. However, if the redistribution metal layer 350 is formed on the passivation layer of the semiconductor chip, the second connection points 356a, 356b, 356c, 356d, 356e, 356f, 356g, 356h, 356i and 356j of the redistribution metal layer 350 can be connected to the third connection points of the leads 514a, 514b, 514c, 514d, 514e, 514f, 514g, 514h, 514i and 514j respectively, as shown in FIG. 4B. As described above, the circuitry component, such as printed circuit board, adapted to be connected to the first connection points 340a, 340b, 340c, 340d, 340e, 340f, 340g, 340i and 340j may be different from the circuitry component, such as lead frame, adapted to be connected to the second connection points 356a, 356b, 356c, 356d, 356e, 356f, 356g, 356h, 356i and 356j.

Figure 5:
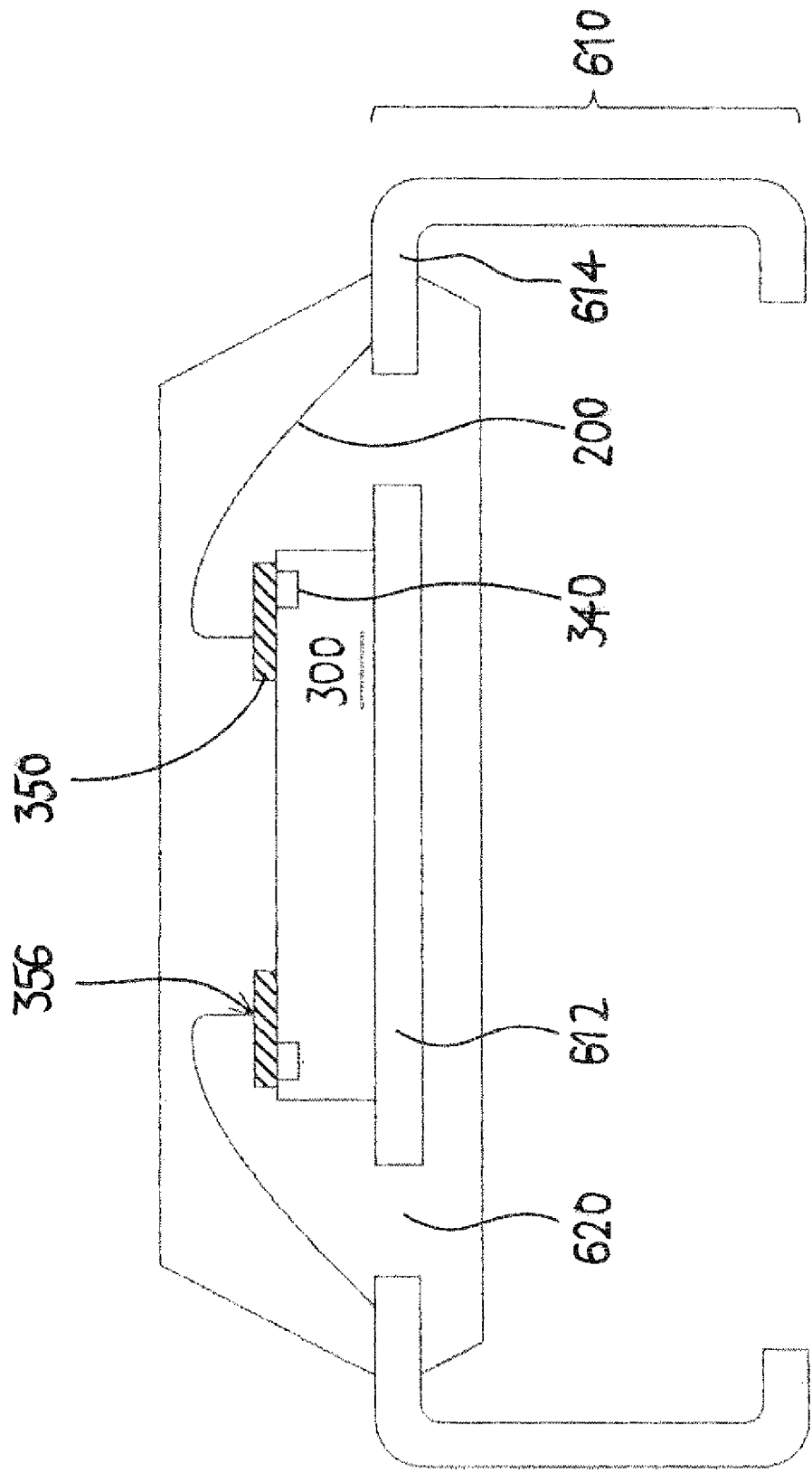
FIG. 5 is a cross-sectional view showing the invented semiconductor chip applied to a SOJ package according to an embodiment of the present invention.

Besides its use in TSOP chip packages, the redistribution lines of the invention allows its use in SOJ packages, described as follows. FIG. 5 is a cross-sectional view showing the invented semiconductor chip applied to a SOJ package according to an embodiment of the present invention. As shown in FIG. 5, the semiconductor chip 300 is mounted on a die pad 612 of a lead frame 610, with multiple wirebond wires 200 connecting the redistributed connection points 356 of the redistribution metal layer 350 on the passivation layer of the semiconductor chip 300 to multiple leads 614 of the lead frame 610. A packaging polymer structure 620 encapsulates the semiconductor chip 300, the wirebond wires 200 and the die pad 612. The leads 614 of the SOJ chip package's lead frame 610 are bent in a J-lead fashion.

Furthermore, the semiconductor chip having the features shown in FIGS. 3C and 3D can also be utilized in chip packages with lead frames, such as TSOP or SOJ packages.

A detailed description of manufacturing the above semiconductor chip 300, BGA chip package, TSOP chip package, and SOJ chip package is in the following paragraphs.

First, referring to FIGS. 2A and 2B, a semiconductor wafer 300 with a passivation layer 330 and at least one original IC connection point 340 is provided. At least one first opening 330a in the passivation layer 330 exposes the original IC connection point 340. Second, the redistribution metal layer 350 is formed over and in touch with the passivation layer 330 and connected to the original IC connection point 340. The redistribution metal layer 350 has at least one redistributed connection point 356, wherein the position, sequence, or pin assignment of the redistributed connection point 356 from a top view is different from that of original IC connection point 340.

Optionally, an encapsulating polymer layer 360 can be spin-coated on the redistribution metal layer 350. An opening 360a in the encapsulating polymer layer 360 exposes the redistributed connection point 356, as shown in FIG. 2B. Next, the semiconductor wafer is divided into multiple semiconductor chips using a cutting process. Next, a wire-bonding process is performed to form a wirebond wire 200 connecting the redistributed connection point 356 to the connection point on a circuitry component, such as printed circuit board or lead frame, as shown in FIGS. 3A, 4A, and 5. The layout of the second connection point 346 allows the semiconductor chip 300 to be used in various chip packages, such as BGA chip package, TSOP chip package or SOJ chip package.

The redistribution metal layer 350 can be deposited by sputtering an adhesion/barrier layer 354 on a whole top surface of a semiconductor wafer, then sputtering a seed layer on the adhesion/barrier layer 354, then optionally forming a patterned photoresist mask on the seed layer, the seed layer or adhesion/barrier layer 354 being exposed through an opening having a trace pattern in the patterned photoresist mask, then electroplating the bulk metal layer 352 on the seed layer or adhesion/barrier layer 354 exposed by the opening in the patterned photoresist mask, then striping the patterned photoresist mask, and then removing the seed layer and adhesion/barrier layer 354 not covered by the bulk metal layer 352. The details of the adhesion/barrier layer 354, seed layer and bulk metal layer can be referred to as the above-mentioned.

As shown in FIG. 3A showing a BGA chip package, after the semiconductor wafer is divided into multiple semiconductor chips, the semiconductor chip 300 is mounted on a top surface of a printed circuit board or substrate 410. Next, multiple wirebond wires 200 are formed to connect wirebond pads 356 of the redistribution metal layer 350 on the semiconductor chip 300 to the other wirebond pads 412 on the printed circuit board 410. Next, a packaging polymer structure 420 is formed to cover the semiconductor chip 300 and the wirebond wires 200. Next, multiple solder balls 430 are formed on a bottom surface of the printed circuit board 410 to connect the printed circuit board 410 to an external circuitry component (unshown).

As shown in FIG. 3A showing a BGA chip package, after the semiconductor wafer is divided into multiple semiconductor chips, the semiconductor chip 300 with a redistribution metal layer 350 is mounted on a die pad 512 of a lead frame 510. Next, multiple wirebond wires 200 are formed to connect the redistribution metal layer 350 of the semiconductor chip 300 to multiple leads 514 of the lead frame 510. Next, a packaging polymer structure 520 is formed to encapsulate the semiconductor chip 300, the wirebond wires 200 and the die pad 512. Next, the leads 514 of the TSOP chip package's lead frame 510 are bent in a Gull Wing fashion.

The packaging process of the SOJ package illustrated in FIG. 5 is similar to the TSOP packaging process. In contrast to the TSOP packaging process, the leads 514 of the SOJ package are bent into J-shapes.

The described assembly process has the following advantages:

1. In comparison to the prior art, the invented chip structure with a redistribution layer and process for the same do not need an elastomer layer. That is, the invented structure and its process allows the direct placement of the bonding wire on the redistributed connection point that has active devices underneath; it greatly extends design flexibility.

2. The invented chip structure with a redistribution layer can be used in a number of chip packages that utilize the wire-bonding process, such as BGA, TSOP, and SOJ packages.

3. In comparison to prior arts, the invented process does not require an additional polymer layer serving as elastomer layer between redistribution layer and IC passivation layer; thus, the fabrication of the semiconductor chip 300 is economic and time-saving.

It will be apparent to those skilled in the art that various modifications and variations can be made to the structure of the present invention without departing from the scope or spirit of the invention. For example, it is possible that the wire-bonding pad is not electrically connected to the testing pad or to the bump pad. In view of the foregoing, it is intended that the present invention cover modifications and variations of this invention provided they fall within the scope of the following claims and their equivalents.

What is claimed is:

1. A semiconductor chip assembly comprising:
a chip comprising a semiconductor substrate, a MOS device in or on said semiconductor substrate, a metallization structure over said semiconductor substrate, a passivation layer over said metallization structure, wherein said passivation layer comprises a nitride layer, and wherein a first opening in said passivation layer is over an original IC connection point of said metallization structure and exposes said original IC connection point, a metal trace over said passivation layer and over said original IC connection point, wherein said metal trace is connected to said original IC connection point through said first opening, and a redistributed pad connected to said original IC connection point through said metal trace, wherein said metal trace does not connect said original IC connection point to any other metal portion under said passivation layer, wherein said redistributed pad has a position from a top view different from that of said original IC connection point, wherein said redistributed pad is entirely over said passivation layer, and no opening in said passivation layer is under said redistributed pad, wherein said redistributed pad comprises an adhesion/barrier layer, a first gold layer over said adhesion/barrier layer, and a second gold layer over said first gold layer, wherein said second gold layer contains gold with greater than 90 weight percent and has a thickness between 2 and 30 micrometers, and wherein said chip has a first edge and a second edge neighboring to said first edge, wherein the minimum distance between said first edge and said original IC connection point is smaller than that between said second edge and said original IC connection point, and the minimum distance between said first edge and said redistributed pad is greater than that between said second edge and said redistributed pad; and
a wire wirebonded to said redistributed pad, wherein said wire is across said second edge.

2. The semiconductor chip assembly of claim 1, wherein said adhesion/barrier layer comprises titanium.

3. The semiconductor chip assembly of claim 1, wherein said MOS device is under said redistributed pad.

4. The semiconductor chip assembly of claim 1 further comprising a circuit board and multiple solder balls under said circuit board, wherein said chip is over said circuit board and said wire connects said redistributed pad to said circuit board.

5. The semiconductor chip assembly of claim 1, wherein said chip further comprises a polymer layer over said passivation layer and on said metal trace, wherein a second opening in said polymer layer is over said redistributed pad and exposes said redistributed pad.

6. The semiconductor chip assembly of claim 5, wherein said polymer layer has a thickness between 2 and 15 micrometers.

7. The semiconductor chip assembly of claim 1, wherein said nitride layer has a thickness between 0.2 and 1.2 micrometers.

8. A chip package comprising:
a chip comprising a semiconductor substrate, a MOS device in or on said semiconductor substrate, a metallization structure over said semiconductor substrate, a passivation layer over said metallization structure, wherein said passivation layer comprises a nitride layer, and wherein a first opening in said passivation layer is over a first original IC connection point of said metallization structure and exposes said first original IC connection point, and a second opening in said passivation layer is over a second original IC connection point of said metallization structure and exposes said second original IC connection point, a metal trace over said passivation layer, wherein said metal trace is connected to said first original IC connection point through said first opening, a redistributed pad connected to said first and second original IC connection points through said first and second openings, wherein said redistributed pad is connected to said first original IC connection point through said metal trace, wherein said redistributed pad has a position from a top view different from those of said first and second original IC connection points, wherein said redistributed pad is entirely over said passivation layer, and no opening in said passivation layer is under said redistributed pad, and wherein said redistributed pad comprises a titanium-containing layer, a first gold layer over said titanium-containing layer, and a second gold layer over said first gold layer, wherein said second gold layer contains gold with greater than 90 weight percent and has a thickness between 2 and 30 micrometers, and a polymer layer over said passivation layer and on said metal trace, wherein a third opening in said polymer layer is over said redistributed pad and exposes said redistributed pad; and
a wire wirebonded to said redistributed pad, wherein said wire is across an edge of said chip.

9. The chip package of claim 8, wherein said MOS device is under said redistributed pad.

10. The chip package of claim 8 further comprising a circuit board and multiple solder balls under said circuit board, wherein said chip is over said circuit board and said wire connects said redistributed pad to said circuit board.

11. The chip package of claim 8, wherein said polymer layer comprises polyimide.

12. The chip package of claim 8, wherein said polymer layer has a thickness between 2 and 15 micrometers.

13. The chip package of claim 8, wherein said nitride layer has a thickness between 0.2 and 1.2 micrometers.

14. A semiconductor chip assembly comprising:
a chip comprising a semiconductor substrate, a MOS device in or on said semiconductor substrate, a metallization structure over said semiconductor substrate, a passivation layer over said metallization structure, wherein said passivation layer comprises a nitride layer, and wherein a first opening in said passivation layer is over an original IC connection point of said metallization structure and exposes said original IC connection point, a first redistributed pad connected to said original IC connection point through said first opening, wherein said first redistributed pad has a position from a top view different from that of said original IC connection point, wherein said first redistributed pad is entirely over said passivation layer, and no opening in said passivation layer is under said first redistributed pad, and wherein said first redistributed pad comprises an adhesion/barrier layer, a first gold layer over said adhesion/barrier layer, and a second gold layer over said first gold layer, wherein said second gold layer contains gold with greater than 90 weight percent and has a thickness between 2 and 30 micrometers, and a second redistributed pad connected to said original IC connection point through said first opening, wherein said second redistributed pad has a position from a top view different from that of said original IC connection point, and wherein said second redistributed pad is entirely over said passivation layer, and no opening in said passivation layer is under said second redistributed pad; and
a wire wirebonded to said first redistributed pad, wherein said wire is across an edge of said chip.

15. The semiconductor chip assembly of claim 14, wherein said adhesion/barrier layer comprises titanium.

16. The semiconductor chip assembly of claim 14, wherein said MOS device is under said first redistributed pad.

17. The semiconductor chip assembly of claim 14 further comprising a circuit board and multiple solder balls under said circuit board, wherein said chip is over said circuit board and said wire connects said first redistributed pad to said circuit board.

18. The semiconductor chip assembly of claim 14, wherein said chip further comprises a polymer layer over said passivation layer, wherein a second opening in said polymer layer is over said first redistributed pad and exposes said first redistributed pad.

19. The semiconductor chip assembly of claim 18, wherein said polymer layer has a thickness between 2 and 15 micrometers.

20. The semiconductor chip assembly of claim 14, wherein said nitride layer has a thickness between 0.2 and 1.2 micrometers.

* * * * *